United States Patent
Kadow et al.

(10) Patent No.: US 8,502,307 B2
(45) Date of Patent: Aug. 6, 2013

(54) VERTICAL POWER SEMICONDUCTOR CARRIER HAVING LATERALLY ISOLATED CIRCUIT AREAS

(75) Inventors: Christoph Kadow, Gauting (DE); Thorsten Meyer, München (DE)

(73) Assignee: Infineon Technologies AG, Neubiberg (DE)

( * ) Notice: Subject to any disclaimer, the term of this patent is extended or adjusted under 35 U.S.C. 154(b) by 332 days.

(21) Appl. No.: 12/953,682

(22) Filed: Nov. 24, 2010

(65) Prior Publication Data

US 2012/0126318 A1 May 24, 2012

(51) Int. Cl.
*H01L 29/66* (2006.01)

(52) U.S. Cl.
USPC ....... 257/334; 257/E23.08; 257/351; 438/107

(58) Field of Classification Search
USPC ..................... 257/334, E23.01, 351; 438/107
See application file for complete search history.

(56) References Cited

U.S. PATENT DOCUMENTS

| | | | |
|---|---|---|---|
| 4,704,368 | A | 11/1987 | Goth et al. |
| 6,177,291 | B1 | 1/2001 | Eriguchi et al. |
| 2012/0012924 | A1 | 1/2012 | Meiser et al. |

FOREIGN PATENT DOCUMENTS

| | | |
|---|---|---|
| DE | 3688388 T2 | 11/1993 |
| DE | 19638439 A1 | 4/1998 |
| DE | 69418143 T2 | 8/1999 |

*Primary Examiner* — Thao Le
*Assistant Examiner* — Matthew Gordon
(74) *Attorney, Agent, or Firm* — Murphy, Bilak & Homiller, PLLC

(57) ABSTRACT

An integrated circuit includes a semiconductor carrier including a first side and a second side opposite the first side. An FET is in a first area of the semiconductor carrier, and has a drain electrically coupled to a drain contact area at the first side and a source electrically coupled to a source contact area at the second side. First circuit elements are in a second area of the semiconductor carrier. The second area is electrically insulated from the semiconductor carrier surrounding the second area via a trench insulation extending through the semiconductor carrier from the first side to the second side. An interconnection level electrically interconnects the first circuit elements at the second side, and is electrically insulated from the source contact area in the entire second area via an insulating layer at the second side. A conductive pathway extends through the semiconductor carrier from the first side to the second side, and is electrically insulated from the semiconductor carrier surrounding the conductive pathway. At least one of the first circuit elements is electrically coupled to a contact area at the first side via the conductive pathway.

25 Claims, 4 Drawing Sheets

VERTICAL POWER SEMICONDUCTOR CARRIER HAVING LATERALLY ISOLATED CIRCUIT AREAS

BACKGROUND

Power semiconductor devices are included in a vast variety of integrated circuits for semiconductor applications such as automotive, industrial, power management or control and drives. Ruggedness and power dissipation capability constitute key parameters of such integrated circuits. It is desirable to improve the ruggedness and the power dissipation capability of integrated circuits including a power semiconductor device.

SUMMARY

According to an embodiment of an integrated circuit, the integrated circuit includes a semiconductor carrier including a first side and a second side opposite the first side. The integrated circuit further includes an FET (field effect transistor) in a first area of the semiconductor carrier, a drain of the FET being electrically coupled to a drain contact area at the first side and a source of the FET being electrically coupled to a source contact area at the second side. The integrated circuit further includes first circuit elements in a second area of the semiconductor carrier, the second area being electrically insulated from the semiconductor carrier surrounding the second area via a trench insulation extending from the first side to the second side. The integrated circuit further includes an interconnection level electrically interconnecting the first circuit elements at the second side, the interconnection level being electrically insulated from the source contact area in the entire second area via an insulating layer. The integrated circuit further includes a conductive pathway extending through the semiconductor carrier from the first side to the second side, the conductive pathway being electrically insulated from the semiconductor carrier surrounding the conductive pathway. At least one of the circuit elements is electrically coupled to a contact area at the first side via the conductive pathway.

According to another embodiment of an integrated circuit, the integrated circuit includes a semiconductor carrier including a first side and a second side opposite the first side. The integrated circuit further includes a FET in a first area of the semiconductor carrier. The integrated circuit further includes first circuit elements in a second area of the semiconductor carrier, the second area being electrically insulated from the semiconductor carrier surrounding the second area via a trench insulation extending from the first side to the second side. The integrated circuit further includes a first interconnection level and a second interconnection level at the second side of the semiconductor carrier. The first interconnection level is arranged between the semiconductor carrier and the second interconnection level. At least one of the first circuit elements in the second area is electrically coupled to a contact area at the first side via the first interconnection level and via a conductive pathway extending through the semiconductor carrier from the second side to the first side, the conductive pathway being electrically insulated from the semiconductor carrier surrounding the conductive pathway. The second interconnection level is electrically disconnected from the first interconnection level in the second area and is electrically coupled to a source of the FET located at the second side via the first interconnection level in the first area.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts. The features of the various illustrated embodiments can be combined unless they exclude each other.

Embodiments are depicted in the drawings and are detailed in the description which follows.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the Figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

A number of embodiments will be explained below. In this case, identical structural features are identified by identical reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor carrier.

Figure 1:
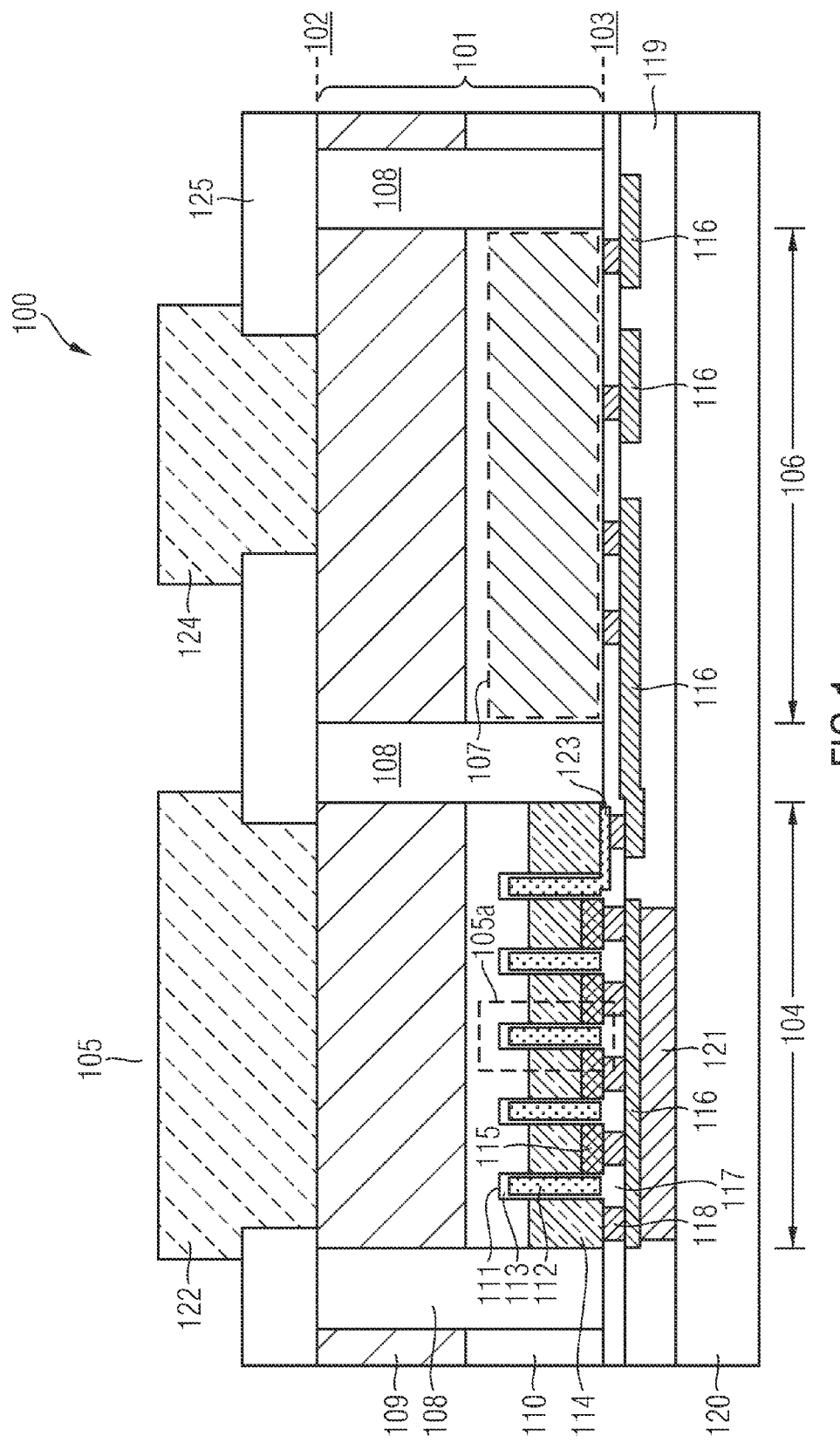
FIG. 1 illustrates a cross-section of a portion of one embodiment of an integrated circuit including a power trench p-channel MOSFET (PMOS) in a first area and circuit elements in a second area.

FIG. 1 illustrates a portion of an integrated circuit 100 including a p-type semiconductor carrier 101. A first surface or first side 102 of the p-type semiconductor carrier 101 is opposite a second surface or second side 103 of the p-type semiconductor carrier 101.

In a first area 104 of the semiconductor carrier 101, a power p-channel MOSFET (PMOS) 105 is formed. In a second area 106 of the semiconductor carrier 101, circuit elements are formed by semiconductor zones within the semiconductor carrier 101. The power PMOS may be capable of switching currents of more than 0.5 A. The power PMOS may include a plurality of PMOS cells having an on-state resistance-area product of $R_{on} \times A < 100$ mΩ mm² at a blocking voltage of 50 V. Since a vast variety of circuit elements may be formed in the second area 106 by suitable semiconductor zones, these semiconductor zones constituting respective circuit elements are not illustrated in detail in FIG. 1 but implied by a simplified circuit element area 107. The circuit elements included in the circuit element area 107 of the second area 106 are electrically insulated from the semiconductor carrier 101 surrounding the second area 106 via a trench insulation 108 extending from the first side 102 to the second side 103 through the p-type semiconductor carrier 101. At least one of the circuit elements in the circuit element area 107 is electrically coupled to a contact area at the first side 102 via a conductive pathway such as a conductive through-hole that is electrically insulated from the semiconductor carrier surrounding the conductive pathway (not illustrated in FIG. 1, cf. conductive pathway 137 and circuit elements 132, 138 illustrated in FIG. 3, for example).

In the embodiment illustrated in FIG. 1, p-type semiconductor carrier 101 includes a first p⁺-type carrier portion 109 at the first side 102 and a second p-type carrier portion 110 at the second side 103. A semiconductor region denoted p⁺-type includes a higher concentration of dopants than a semiconductor region denoted p-type. The first p⁺-type carrier portion 109 may be a p⁺-type silicon substrate and the second p-type carrier portion 110 may be a p-type epitaxial layer grown on the p⁺-type semiconductor substrate. According to other embodiments, the p-type semiconductor carrier 101 includes a semiconductor material different from silicon, e.g. a compound semiconductor material, and it may also include a stack of semiconductor layers different from the stack illustrated in FIG. 1.

The PMOS 105 includes a plurality of trenches 111 extending into the p-type semiconductor carrier 101 from the second side 103. A gate electrode 112 is formed within each one of the trenches 111 and includes conductive materials such as doped semiconductor materials or metals, e.g. doped polysilicon. The gate electrode 112 is electrically insulated from the semiconductor carrier 101 surrounding the trenches 111 by a dielectric structure 113. The dielectric structure 113 may include a gate insulating layer and a field insulating layer such as a gate oxide layer, e.g. a thermal oxide, and a field oxide layer, for example.

An n-type body zone 114 is arranged within the second p-type carrier portion 110 and adjoins to the second side 103. P⁺-type source regions 115 are embedded in the n-type body zone 114. The source regions 115 laterally adjoin to sidewalls of the trenches 111. The source regions 115 also adjoin to the second side 103. The body zone 114 as well as the source regions 115 are electrically coupled to a source contact area 120 via an interconnection level 116.

The interconnection level 116 may include a plurality of interconnection wirings such as metal wirings electrically insulated from the semiconductor carrier 101 by a first interlayer dielectric 117 such as an insulating oxide and/or nitride, e.g. $SiO_2$ and/or $Si_3N_4$. First contact openings 118 in the first interlayer dielectric 117 that are filled with conductive material such as W provide an electrical connection between the body zone 114 and the interconnection level 116 and an electrical connection between the source regions 115 and the interconnection level 116.

A second interlayer dielectric 119 such as an insulating oxide and/or nitride, e.g. $SiO_2$ and/or $Si_3N_4$, provides electrical insulation between the interconnection level 116 within the entire second area 106 and the source contact area 120. In other words, no contact openings are formed in the second interlayer dielectric 119 in the second area 106. The source contact area 120 covers both the first area 104 and the second area 106. According to other embodiments, more than one interconnection level may be formed between the source contact area 120 and the semiconductor carrier 101.

A second contact opening 121 in the second interlayer dielectric 119 in the first area 104 that is filled with conductive material such as W provides electrical connection between the first interconnection layer 116 and the source contact area 120.

The PMOS 105 further includes a drain contact area 122 at the first side 102. The drain contact area 122 is in electrical contact with the first p⁺-type carrier portion 109, the first p⁺-type carrier portion 109 in the first area 104 constituting a drain of PMOS 105.

The gate electrodes 112 in the trenches 111 are electrically connected to one another (not illustrated in FIG. 1) and are electrically coupled to circuit elements of circuit element area 107 via the interconnection level 116, one of the first contact openings 118 and a connection line 123. According to one embodiment, the gate electrodes 112 are electrically coupled to a gate driver including gate driver circuit elements within circuit element area 107. Circuit elements included in the circuit element area 107 may also be electrically coupled via a contact area 124 at the first side 102. The contact area 124 and the drain contact area 122 may be part of a same interconnection level or metal level at the first side 102, for example. A third interlayer dielectric 125 is arranged at the first side 102.

One example of a method for manufacturing an integrated circuit such as integrated circuit 100 illustrated in FIG. 1 includes the process features as follows. Trenches are etched through a semiconductor carrier. One part of the trenches is filled with insulating material to provide a trench insulation between the neighboring parts of the semiconductor carrier. Another part of the trenches is filled with insulating material and conductive material to provide a conductive pathway between a first side and a second side of the semiconductor carrier, the conductive material in the trench being electrically insulated from the semiconductor carrier surrounding the trench via the insulating material. A power p-channel MOSFET as well as circuit elements are formed within the semiconductor carrier at the second side by appropriate semiconductor processes such as implantation of ions for manufacturing semiconductor zones via the second side. An interconnection level, a source contact area as well as interlayer dielectrics are formed at the second side of the semiconductor carrier. The thickness of the semiconductor carrier may be reduced by removing material of the semiconductor carrier from the first side that is opposite to the second side where the interconnection level has been formed. As an example, the reduced thickness may range between 10 μm and 250 μm, in particular between 25 μm and 200 μm. Then, contact areas as well as an interlayer dielectric are formed on the first side of the semiconductor carrier. Further processes such as passivation and assembly may follow to complete the integrated circuit. Additional processes may be carried out before, between or after the specific processes described above.

According to one embodiment, the integrated circuit 100 is mounted to a lead frame, e.g. a Cu lead frame, via the source contact area 120. This allows to improve thermal connection of the PMOS 105 to the lead frame. Thus, power dissipation in PMOS 105 of integrated circuit 100 can be improved.

The integrated circuit 100 employing a trench power PMOS is particularly attractive for high-side switches for several reasons:

By forming the PMOS 105 as the power transistor in the first area 104 instead of an n-channel MOSFET (NMOS), the resistance of the body zone 114 may be reduced due to the higher mobility of electrons in Si compared to holes. This allows to reduce a current amplification of a parasitic bipolar transistor of PMOS 105 including the body zone 114 as a base. Thus, power dissipation capabilities and ruggedness may be improved compared to an integrated circuit including an NMOS instead of PMOS 105.

Since a high-side switch realized by integrated circuit 100 illustrated in FIG. 1 does not require a charge pump due to the fact that a PMOS is used as a switch, electromagnetic compatibility (EMC) emission can be reduced and the switching speed increased compared to a high-side switch including an NMOS and a charge pump.

In other applications than high-side switches, an NMOS may be used instead of the PMOS as a power device for other application-specific reasons.

Since analog and digital circuits formed by respective circuit elements in a circuit element area such as circuit element area 107 of integrated circuit 100 are electrically insulated from the source contact area connected to a supply voltage $V_{BAT}$ e.g. in a high-side switch, ruggedness with regard to pulse disturbances between a supply voltage pin and a ground voltage pin and between an input/output pin and the supply voltage pin, respectively, can be improved.

Monolithic integration of the PMOS 105 and circuit elements in the circuit element area 107 in one semiconductor carrier 101 further allows to improve precision of temperature and current measurements and the response speed of such measurements. Since respective sensor elements can be kept smaller compared to a multi-chip solution including the power transistor such as the PMOS in one semiconductor die and the digital and/or analog circuits in another semiconductor die. Further, monolithic integration of the PMOS 105 and digital/analog circuit elements within one semiconductor carrier 101 allows to simplify and reduce costs of assembly compared to a multi-chip solution. As an example, bond wires have to be provided only with regard to the single chip including semiconductor carrier 101.

Figure 2:
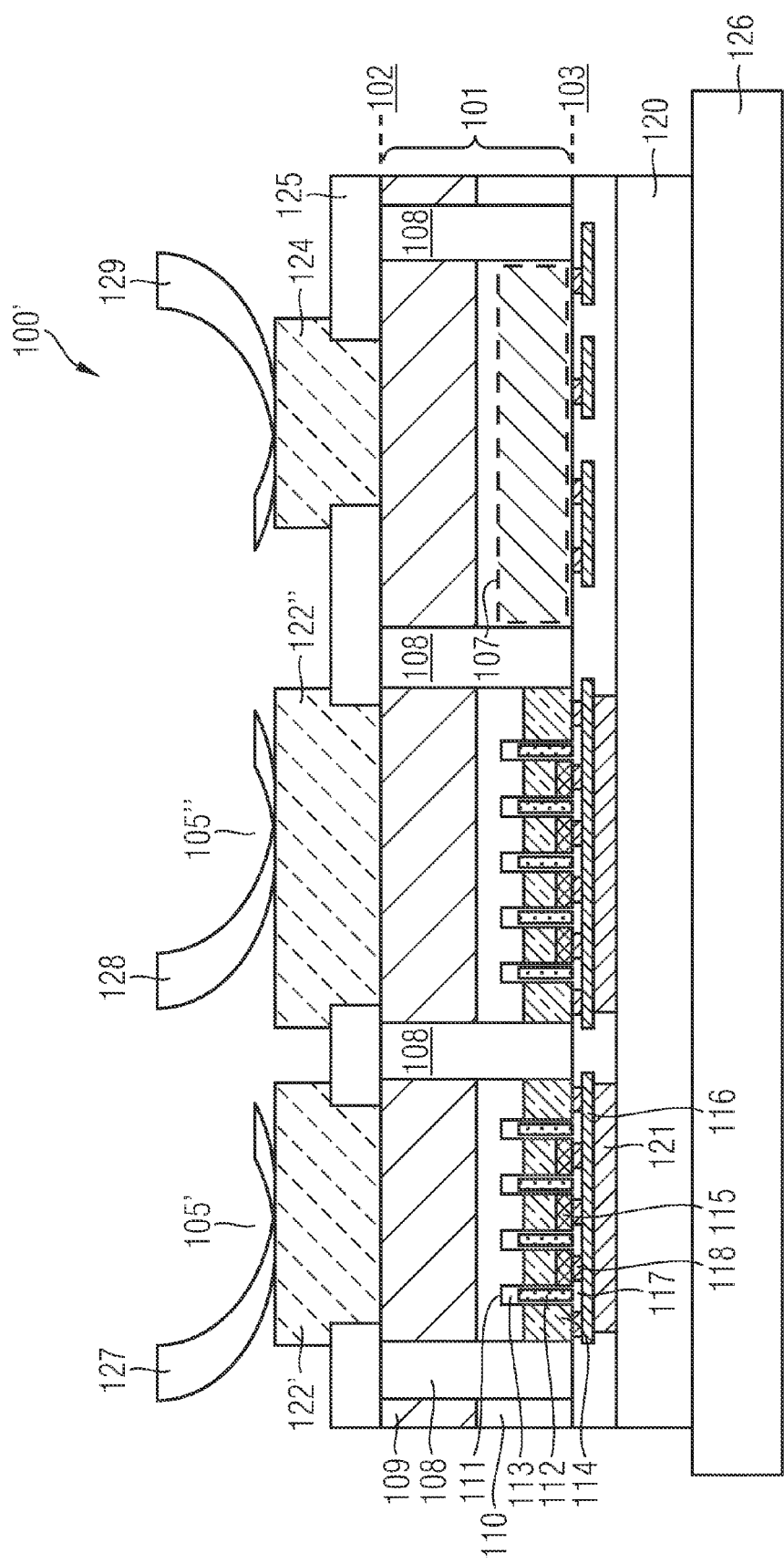
FIG. 2 illustrates a cross-section of a portion of another embodiment of an integrated circuit including two power PMOS transistors.

FIG. 2 illustrates a cross-section of a portion of an integrated circuit 100' according to another embodiment. Integrated circuit 100' includes at least two PMOS transistors 105' and 105". In each one of the PMOS transistors 105', 105" a plurality of PMOS cells such as cell 105a in FIG. 1 are formed. PMOS transistors 105' and 105" share a common source, i.e. the common source contact area 120. The drains of PMOS areas 105', 105" can be independently accessed by separate drain contact areas 122', 122". The PMOS transistors 105', 105" may thus be connected to separate pins such as separate output pins via the drain contact areas 122', 122" and associated bond wires 127, 128. A bond wire 129 is arranged on the contact area 124 that is electrically coupled to the circuit elements in circuit area 107. The bond wire 129 may electrically couple the circuit elements in the circuit area 107, e.g. a gate driver circuit, to a pin such as an input pin, for example.

The integrated circuit 100' may be mounted on a lead frame 126, e.g. a Cu lead frame, via the source contact area 120 at the second side 103.

The gate electrodes 112 in PMOS transistors 105' and 105" may be electrically coupled to circuit elements in the circuit element area 107 via the interconnection level 116 as illustrated in FIG. 1 (not illustrated in FIG. 2). With regard to further elements illustrated in FIG. 2, reference is taken to similar or corresponding elements of integrated circuit 100 illustrated in FIG. 1.

Figure 3:
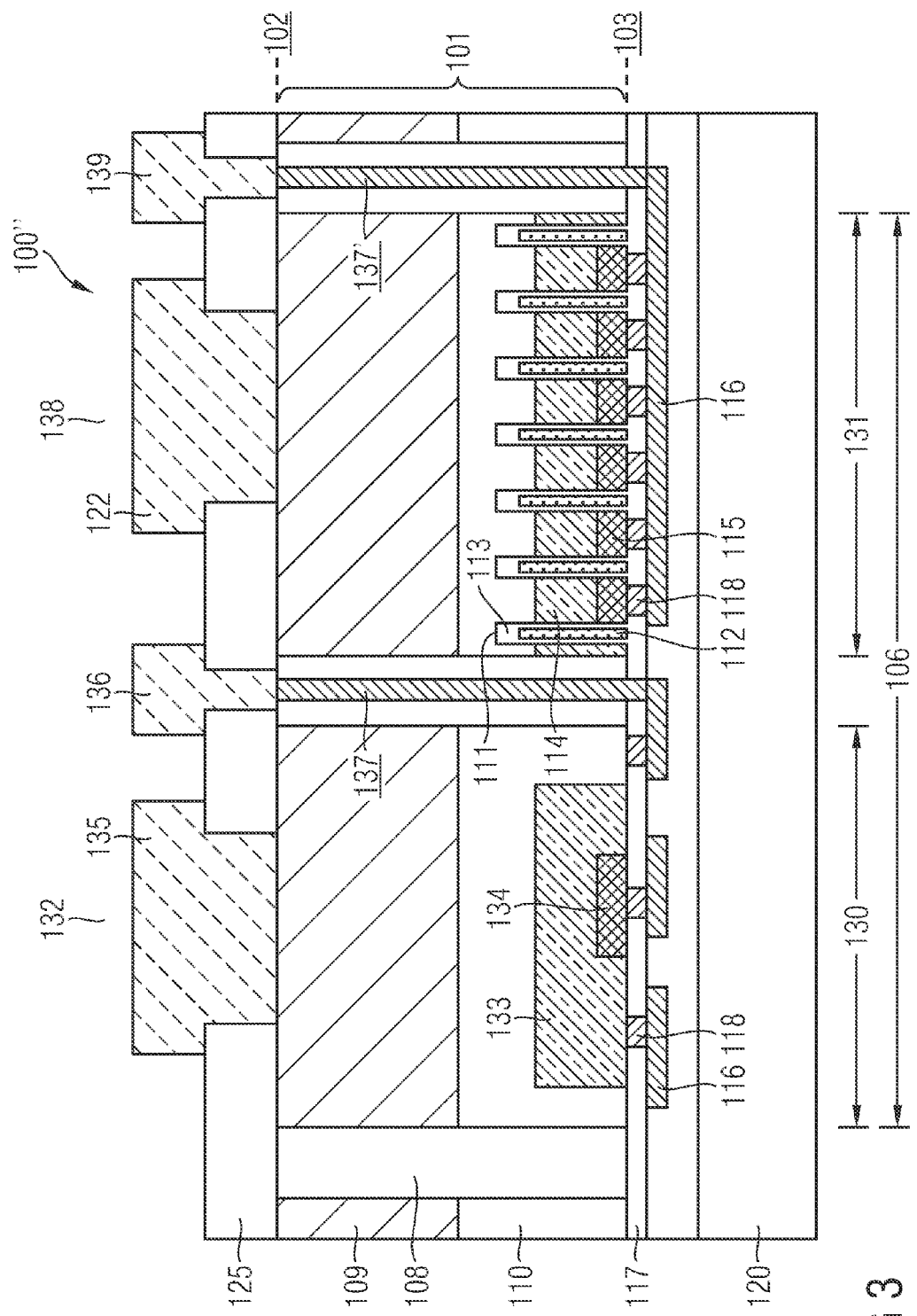
FIG. 3 illustrates a cross-section of a portion of yet another embodiment of an integrated circuit including an analog pnp-transistor and an analog trench PMOS in a second area.

FIG. 3 illustrates a cross-section of a portion of an integrated circuit 100" according to yet another embodiment. Integrated circuit 100" includes a first circuit cell area 130 and a second circuit cell area 131. The semiconductor carrier 101 in the first circuit cell area 130 is electrically insulated from the semiconductor carrier 101 in the second circuit cell area 131. The first circuit cell area 130 and the second circuit cell area 131 are part of the second area 106 including analog and/or digital circuit cell elements such as circuit elements of gate driver circuit.

In the first circuit cell area 130 a vertical pnp-transistor 132 is formed. The vertical pnp-transistor 132 includes an n-type base 133 adjoining the second side 103, a p$^+$-type emitter 134 and a collector including those portions of the semiconductor carrier 101 in the first cell area 130 that surround the base 133. An electrical contact to the base 133 and emitter 134 is provided by contact openings 118 filled with conductive material and the interconnection level 116 at the second side 103. An electrical contact to the collector is provided at the second side 103 and at the first side 102. At the first side 102, a first collector contact 135 adjoins the p$^+$-type semiconductor carrier portion 109. A second collector contact 136 arranged at the first side 102 is electrically coupled to the second p-type semiconductor carrier portion 110 at the second side 103 via a contact opening 118, the interconnection level 116 and a conductive pathway 137.

In the second cell area 131 an analog p-channel MOSFET 138 (PMOS 138) is formed. PMOS 138 includes structural elements such as a body, source and drain similar to the structural elements of PMOS 105 illustrated in FIG. 1. The source regions 115 are electrically coupled to a source contact 139 at the first side 102 via a conductive pathway 137', the interconnection level 116 and contact openings 118. Electrical contact to the body zone 114 as well as electrical contact to the gate electrodes 112 may also be provided via contact openings 118, the interconnection level 116 and a conductive pathway similar to conductive pathway 137, 137' (not illustrated in FIG. 3).

The vertical pnp-transistor 123 as well as the PMOS 138 constitute examples of circuit elements formed in the second area 106. A vast variety of further or different passive or active circuit elements, e.g. bipolar transistors, resistors, capacitors, inductors, field effect transistors, may be formed in the second area 106 and be interconnected in a manner to provide one or a plurality of circuit blocks such as a gate driver in the second area 106.

In the second area 106, further circuit cells may be included that lack electrical contacts to the first p$^+$-type body portion 109 at the first side 102, but merely include electrical contacts at the first side 102 that are electrically coupled to semiconductor regions at the second side 103 via contact openings, the interconnection level 116 and conductive pathways.

Further, any one of the integrated circuits illustrated in FIGS. 1-3 may include a third cell area that is similar to the second cell area 106 insofar as it includes digital and/or analog circuit elements, but differs from the second area 106 in that the interconnection level 116 is electrically coupled to the source contact area 120 by one or more contact openings in an interlayed dielectric arranged between the source contact area 120 and the interconnection level 116. Thus, circuit cell areas may also be connected to a source voltage of the power PMOS, e.g. to a supply voltage.

Figure 4:
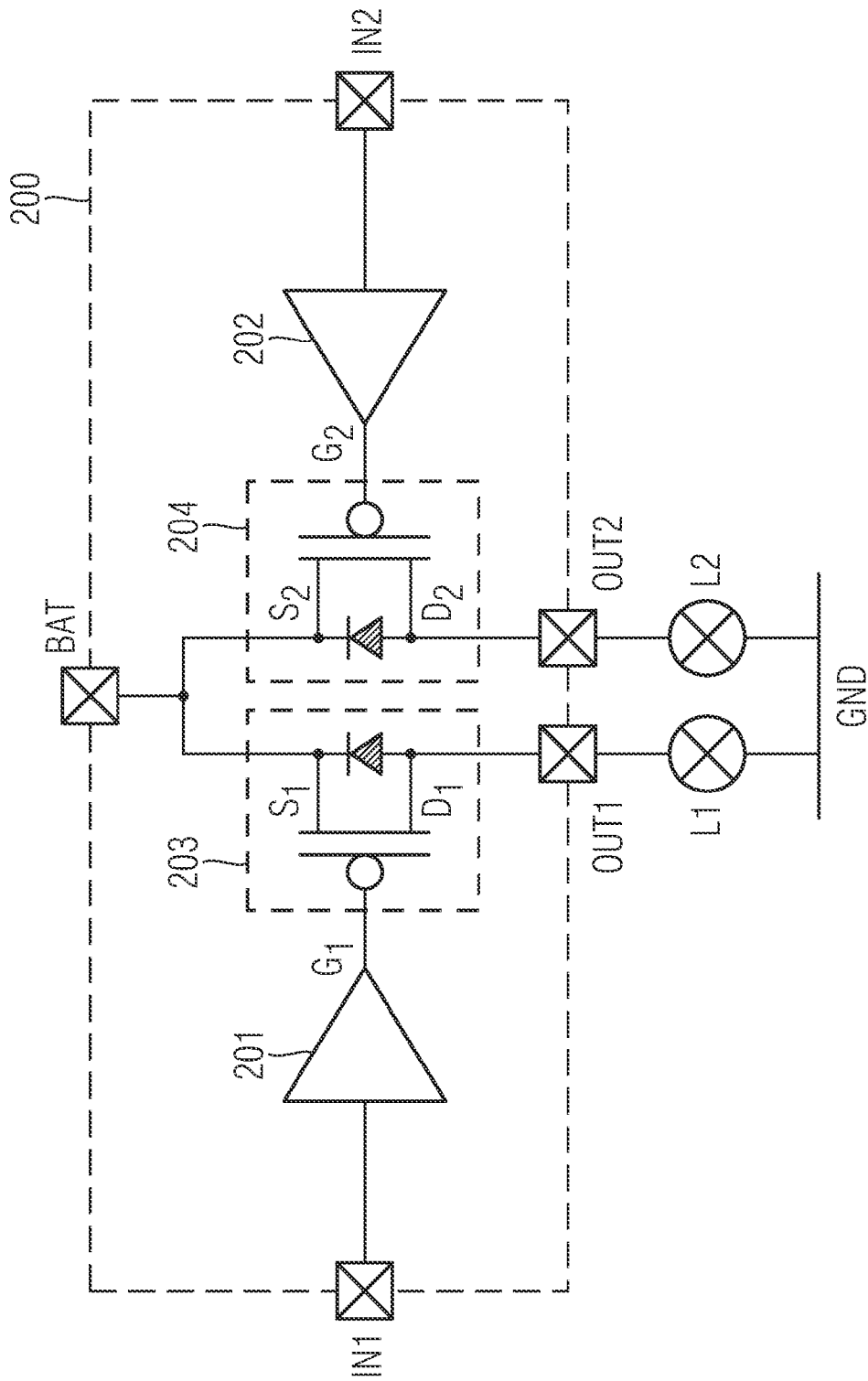
FIG. 4 illustrates a simplified circuit diagram including an integrated circuit according to an embodiment.

FIG. 4 illustrates a simplified circuit diagram of an integrated circuit 200 according to an embodiment. The integrated circuit 200 includes circuit elements such as gate driver circuits 201, 202 and power p-channel MOSFETs 203, 204 that are monolithically integrated. Source $S_1$ of power PMOS 203 and source $S_2$ of power PMOS 204 are common, i.e. interconnected, and electrically coupled to a supply voltage BAT. Drains $D_1$ and $D_2$ of PMOS 203 and PMOS 204 are electrically separated to drive different loads L1, L2 independently at respective output pins OUT1, OUT2. A first input pin IN1 is electrically coupled to a first gate driver circuit 201 configured to drive the gate $G_1$ of PMOS 203 and a second input pin IN2 is electrically coupled to a second gate driver circuit 202 configured to drive the gate $G_1$ of PMOS 204. The loads L1, L2 are connected between OUT1, OUT2 and ground GND, respectively. Thus, integrated circuit 200 constitutes a high side switch according to this embodiment.

Integrated circuit may include further or different circuit elements, e.g. protection circuitry or monitoring circuitry and may include a different number of pins than illustrated in FIG. 4, e.g. a different number of input pins and/or a different number of output pins.

Although FIGS. 1 and 2 referred to a PMOS in the first area, also an NMOS may be used instead of the PMOS.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

As used herein, the term "electrically coupled" is not meant to mean that the elements must be directly coupled together but intervening elements may be provided between the "electrically coupled" elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising:
    a semiconductor carrier including a first side and a second side opposite the first side;
    an FET in a first area of the semiconductor carrier, a drain of the FET being electrically coupled to a drain contact area at the first side and a source of the FET being electrically coupled to a source contact area at the second side;
    first circuit elements in a second area of the semiconductor carrier, the second area being electrically insulated from the semiconductor carrier surrounding the second area via a trench insulation extending from the first side to the second side;
    an interconnection level electrically interconnecting the first circuit elements at the second side, the interconnection level being electrically insulated from the source contact area in the entire second area via an insulating layer; and
    a conductive pathway extending through the semiconductor carrier from the first side to the second side, the conductive pathway being electrically insulated from the semiconductor carrier surrounding the conductive pathway; and
    wherein at least one of the first circuit elements is electrically coupled to a contact area at the first side via a trench contact.

2. The integrated circuit of claim 1, wherein a gate of the FET is electrically coupled to at least one of the first circuit elements via the interconnection level.

3. The integrated circuit of claim 1, wherein the first area includes a plurality of FETs electrically insulated from each other via trench insulations extending from the first side to the second side and each one of the FETs includes at least one FET cell.

4. The integrated circuit of claim 3, wherein the plurality of FETs share a common source.

5. The integrated circuit of claim 1, wherein the first circuit elements include a plurality of semiconductor circuit devices electrically insulated from each other via trench insulations extending from the first side to the second side.

6. The integrated circuit of claim 1, wherein the semiconductor carrier includes a gate driving circuit.

7. The integrated circuit of claim 1, wherein the source contact area covers both the first area and the second area at the second side.

8. The integrated circuit of claim 1, wherein the semiconductor carrier is mounted to a lead frame via the source contact area at the second side.

9. The integrated circuit of claim 1, wherein the FET is a p-channel power MOSFET and the semiconductor carrier includes a first $p^+$-type carrier portion at the first side and a second p-type carrier portion at the second side.

10. The integrated circuit of claim 9, wherein the first $p^+$-type carrier portion is a $p^+$-type silicon semiconductor substrate and the second p-type carrier portion is a p-type epitaxial layer on the $p^+$-type semiconductor substrate.

11. The integrated circuit of claim 1, wherein the interconnection level includes metal lines electrically coupled to the semiconductor carrier in the second area via contact plugs adjoining the second side.

12. The integrated circuit of claim 11, wherein the source contact area is electrically coupled to the source via an intermediate metal layer, the intermediate metal layer being part of the interconnection level.

13. The integrated circuit of claim 1, wherein the conductive pathway includes doped polysilicon material, the doped polysilicon material being electrically insulated from the semiconductor carrier surrounding the conductive pathway via an insulator at sidewalls of the conductive pathway.

14. The integrated circuit of claim 1, further comprising:
    second circuit elements in a third area of the semiconductor carrier, the third area being electrically insulated from the semiconductor carrier surrounding the third area via a trench insulation extending from the first side to the second side; and wherein the source contact area is electrically coupled to at least one of the second circuit elements via the interconnection level.

15. The integrated circuit of claim 14, wherein a gate of the FET is electrically coupled to at least one of the second circuit elements via the interconnection level.

16. The integrated circuit of claim 1, wherein the FET is a power p-channel trench MOSFET.

17. An integrated circuit, comprising:
   a semiconductor carrier including a first side and a second side opposite the first side;
   an FET in a first area of the semiconductor carrier;
   first circuit elements in a second area of the semiconductor carrier, the second area being electrically insulated from the semiconductor carrier surrounding the second area via a trench insulation extending from the first side to the second side;
   a first interconnection level and a second interconnection level at the second side of the semiconductor carrier, the first interconnection level being arranged between the semiconductor carrier and the second interconnection level;
   wherein at least one of the first circuit elements is electrically coupled to a contact area at the first side via the first interconnection level and via a conductive pathway extending through the semiconductor carrier from the second side to the first side, the conductive pathway being electrically insulated from the semiconductor carrier surrounding the conductive pathway; and
   wherein the second interconnection level is electrically disconnected from the first interconnection level in the second area and is electrically coupled to a source of the FET located at the second side via the first interconnection level in the first area.

18. The integrated circuit of claim 17, wherein a gate of the FET is electrically coupled to at least one of the first circuit elements via the first interconnection level.

19. The integrated circuit of claim 17, wherein the second interconnection level is a contiguous metal layer covering both the first area and the second area at the second side.

20. The integrated circuit of claim 17, wherein the semiconductor carrier is mounted to a lead frame via the second interconnection level at the second side.

21. The integrated circuit of claim 17, wherein the semiconductor carrier includes a first $p^+$-type carrier portion at the first side and a second p-type carrier portion at the second side.

22. The integrated circuit of claim 17, further comprising:
   second circuit elements in a third area of the semiconductor carrier electrically insulated from the semiconductor carrier surrounding the third area via a trench insulation extending through the semiconductor carrier from the second side to the first side; and
   wherein the second interconnection level is electrically coupled to at least one of the second circuit elements in the third area via the first interconnection level.

23. The integrated circuit of claim 22, wherein a gate of the FET is electrically coupled to at least one of the second circuit elements via the first interconnection level.

24. The integrated circuit of claim 17, wherein the first circuit elements in the second area include doped semiconductor wells extending into the semiconductor carrier from the second side.

25. The integrated circuit of claim 17, wherein the FET includes a plurality of FET areas electrically insulated from each other via trench insulations extending from the first side to the second side and each one of the FET areas includes at least one FET cell.

* * * * *